(12) United States Patent
Lin et al.

(10) Patent No.: US 7,156,948 B2
(45) Date of Patent: Jan. 2, 2007

(54) WET ETCHING APPARATUS

(75) Inventors: Chi-An Lin, Hsinchu (TW); Kuo-Hung Kuo, Kaohsiung (TW); Ta-Hsin Kuan, Jhudong Township, Hsinchu County (TW); Po-Yi Lo, Taipei (TW); Ming-Hsien Yang, Jhudong Township, Hsinchu County (TW)

(73) Assignee: TPO Displays Corp., Chu-Nan (TW)

( * ) Notice: Subject to any disclaimer, the term of this patent is extended or adjusted under 35 U.S.C. 154(b) by 264 days.

(21) Appl. No.: 10/740,111

(22) Filed: Dec. 17, 2003

(65) Prior Publication Data
US 2004/0238120 A1 Dec. 2, 2004

(30) Foreign Application Priority Data
May 26, 2003 (TW) .............................. 92209612 U

(51) Int. Cl.
*H01L 21/306* (2006.01)
*B44C 1/22* (2006.01)

(52) U.S. Cl. ............................................... 156/345.18
(58) Field of Classification Search ................ 210/106, 210/332, 143, 409; 156/345.15, 345.18
See application file for complete search history.

(56) References Cited

U.S. PATENT DOCUMENTS

| | | | | |
|---|---|---|---|---|
| 4,784,169 A | * | 11/1988 | Striedieck | 134/111 |
| 4,804,464 A | * | 2/1989 | Schevey | 210/96.1 |
| 6,054,059 A | * | 4/2000 | Latimer et al. | 210/767 |
| 2003/0052068 A1 | * | 3/2003 | Lu | 210/798 |
| 2005/0023194 A1 | * | 2/2005 | Petersen et al. | 210/85 |

* cited by examiner

Primary Examiner—Parviz Hassanzadeh
Assistant Examiner—Sylvia R. MacArthur
(74) Attorney, Agent, or Firm—Liu & Liu

(57) ABSTRACT

A wet etching apparatus is disclosed. The apparatus comprises a first tank, containing a first wet etching solution; a filter, having a filter cartridge, connected to the first tank to filter out the impurities in the first solution; a second etching tank, connected to the filter and the first tank in parallel, containing a second solution; a reaction tank, connected to the filter, wherein having a wet etching reaction; an exhaust component, connected to the filter and the reaction tank in parallel; a first pump, delivering the first solution to the reaction tank through the filter; and a second pump, delivering the second solution to the exhaust component to exhaust the solution from the etching tank through the filter.

22 Claims, 3 Drawing Sheets

WET ETCHING APPARATUS

BACKGROUND OF THE INVENTION

1. Field of the Invention

The invention relates to a semiconductor apparatus and more particularly to a wet etching apparatus with an automatic filter cartridge cleaning function.

2. Description of the Related Art

Wet etching is a standard process in the semiconductor industry. FIG. 1 shows a wet etching apparatus 100 for etching glass substrates of TFT-LCD. The apparatus 100 includes etching tanks 102, and 104, each with a capacity of 150 liters, containing an etching solution 10, supply the etching solution 10 to a reaction tank 122 through a duct assembly system, and recycling the etching solvent 10 to etching tanks 102 and 104 with a recycling system (not shown). The above-mentioned duct assembly system further comprises a pump 162, driving the etching solution 10 through the duct assembly system, valves 131 and 132, controlling the flow of etching solution 10 from the etching tanks 102 and 104 respectively, a valve 133, controlling the flow of etching solution 10 from the pump 162, filters 111 and 112, containing one or a plurality of filter cartridges 117 to filter impurities resulted from the etching solution, valves 134 and 135, controlling the flow of etching solution 10 into the filters 111 and 112 respectively, and valves 136 and 137, controlling the flow of etching solution 10 from the filters 111 and 112 into the reaction tank 122 respectively. The etching tanks 106 and 108, each with a capacity of 270 liters, containing etching solution 10 therein, supply etching solution 10 to reaction tanks 124 and 126 respectively or simultaneously by the duct assembly system. The structure of the duct assembly system, supplying etching solution 10 to reaction tanks 124 and 126, is similar to above described duct assembly system hence its description is omitted here. Moreover, the duct assembly system may employ one or more filters. The advantage of the wet etching apparatus 100 is that it contains two filters 111 and 112, and the valves 134, 135, 136, and 137 are controlled to filter the etching solution 10 by a filter 112 during cleaning, repairing, and maintaining the filter 111. Additionally, the etching apparatus 100 can be cleaned, repaired and maintained without being shut down.

When etching a SiOx/SiNy layer on a glass substrate, the SiOx/SiNy layer is sprayed with or soaked in the etching solution 10, such as BFH (HF+NH4F+ surfactant), to cause a reaction. When etching the glass substrate in the reaction tanks 122, 124 and 126, reactants and air bubbles are produced during the chemical reaction mentioned above. As the etching solution is recycled, reactants and air bubbles will adhere to the filter cartridge 117 causing it to jam during chemical reaction, after producing 80~200 glass substrates.

The reactants jamming the filter cartridge 117 cannot be dissolved by water with low solubility, and the bubbles will only gradually disappear over time, hence, the filter cartridge 117 must be cleaned by manually injecting water into the filters 111 and 112 continuously, after producing about 80~200 glass substrates.

Another disadvantage of the conventional method described above, is the manual operation of control valves. The reduction of concentration of the etching solution results from the water injecting into the reaction tanks 122, 124, or 126 and further causing the etching rate of SiOx/SiNy layer on the glass substrates to be abnormal during the etching reaction. As: a result, an excess of glass substrates are wasted due to substandard quality, increasing manufacturing costs, and reducing throughput. Moreover, the manpower required by manual operation also increases costs. Additionally, the filter cartridge 117 cannot be effectively cleaned during a production run as the warning system of the conventional apparatus is not activated until the filter cartridge 117 is completely jammed. Due to this, it is difficult to inject water into the filter cartridge 117 to clean the filter in timely manner, and a new filter cartridge 117 must be installed resulting in downtime, decreased throughput, and increased material costs.

SUMMARY OF THE INVENTION

Accordingly, the invention provides a wet etching apparatus. Compared with the conventional apparatus, the apparatus of the present invention includes a filter cleaning component, and employs a programmable logic controller (PLC) to control the components to clean the filter. The apparatus of the present invention automatically clean the filter at a specified timed during a production run, thereby avoiding the previously described disadvantages.

Additionally, the invention provides a wet etching apparatus. The wet etching apparatus comprises a first tank, containing a first solution, a filter, having a filter cartridge, connected to the first tank to filter out the impurities in the first solution, a second tank, connected to the filter and the first tank in parallel, containing a second solution, a reaction tank, connected to the filter, performing a wet etching reaction, an exhaust component, connected to the filter and the reaction tank in parallel, a first pump, delivering the first solution to the reaction tank through the filter, and a second pump, delivering the second solution through the filter and to the exhaust component to exhaust the solution from the etching tank, thereby achieving the function of automatic filter cleaning.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 2 and 3.

Figure 1:
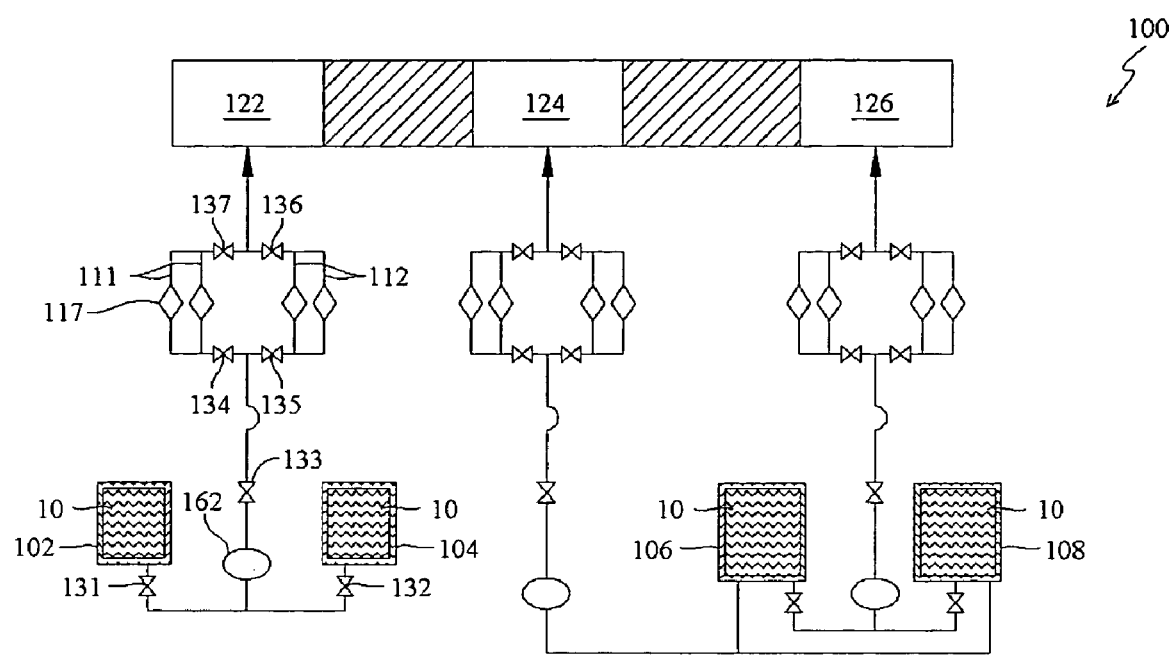
FIG. 1 is an etching module of a conventional wet etching apparatus.
Figure 2:
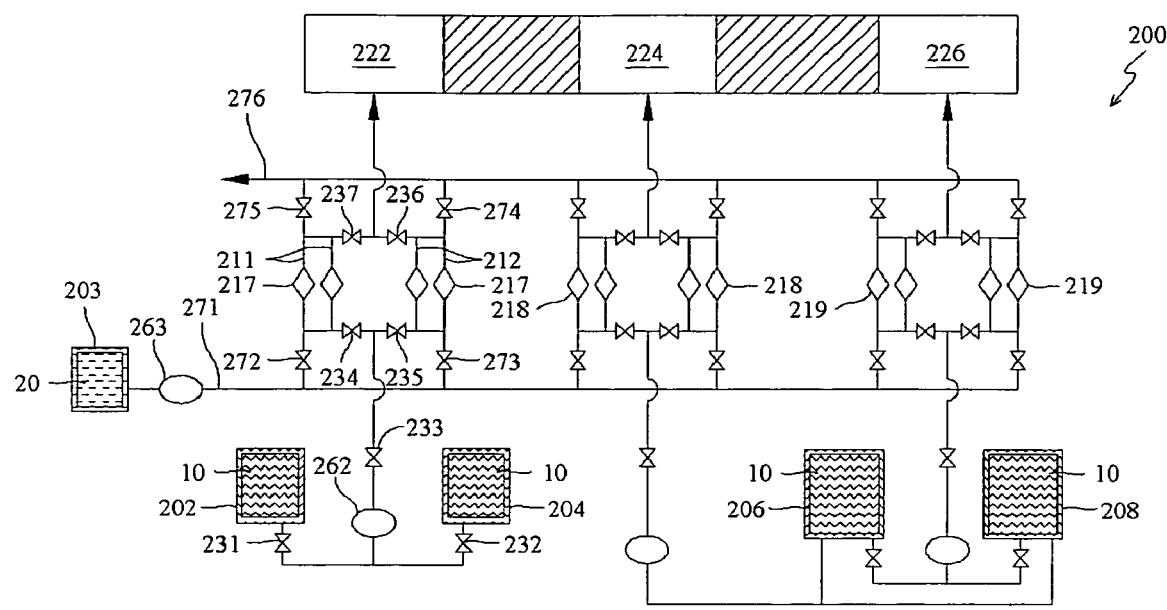
FIG. 2 is an etching module of a wet etching apparatus according to the present invention.

In FIG. 2, a wet etching apparatus 200 of the present invention is shown. The wet etching apparatus 200 includes duct assembly systems: a part of an etching solution used as an etching duct assembly system and another part of a depurant used as a cleaning duct assembly system. The etching tanks 202 and 204, each with a capacity of 150 liters, containing the etching solution 10 therein, supplies the etching solution 10 to a reaction tank 222 through an etching duct assembly system and recycles the etching solution 10 to etching tanks 202 and 204 with a recycling system (not shown). The etching duct assembly system further comprises a pump 262, driving the etching solution 10 through the etching duct assembly system, valves 231 and 232, controlling the flow of etching solution 10 from the etching tanks 202 and 204 respectively, a valve 233, controlling the flow of etching solution 10 from the pump 262, filters 211 and 212, containing one or a plurality of filter cartridges 217 to filter impurities from the etching solution 10, valves 234 and 235, controlling the flow of etching solution 10 into the filters 211 and 212 respectively, and valves 236 and 237, controlling the flow of etching solution 10 from the filters 211 and 212 into the reaction tank 222 respectively. Additionally, the etching tanks 206 and 208, each with a capacity of 270 liters, containing etching solution 10 therein, supply etching solution 10 to reaction tanks 224 and 226 respectively or simultaneously by another etching duct assembly system which is similar to the above-mentioned etching duct assembly system. Accordingly, the structure of the etching duct assembly system, supplying the etching solution to reaction tanks 224 and 226 respectively or simultaneously, is similar to the previously described system, and its description is omitted here. The cleaning duct assembly system of the invention includes a tank 203, with a capacity of 50 liters, containing depurant 20. Preferably the depurant 20 used to clean the filter cartridge 217, is deionized (D.I.) water. The cleaning duct assembly system further comprises, a pump 263, driving the depurant 20 through the cleaning duct assembly system, a pipeline 271, delivering the depurant 20 to each filter, valves 272 and 273, controlling the flaw of the depurant 20 into the filters 211 and 212 respectively, and valves 275 and 274, controlling the flow of depurant 20 from. the filters 211, and 212 into the pipeline 276 to recycle the depurant 20 respectively. In preferred embodiment of the invention, the depurant 20 is supplied and recycled in the tank 203, the pipeline 271, and the pipeline 276 respectively, thereby olso cleaning the filter cartridges 218 and 219 with the depurant 20. Additionally, separate depurant tank, supplying pipeline, and recycling pipelinecan be also connected.

Figure 3:
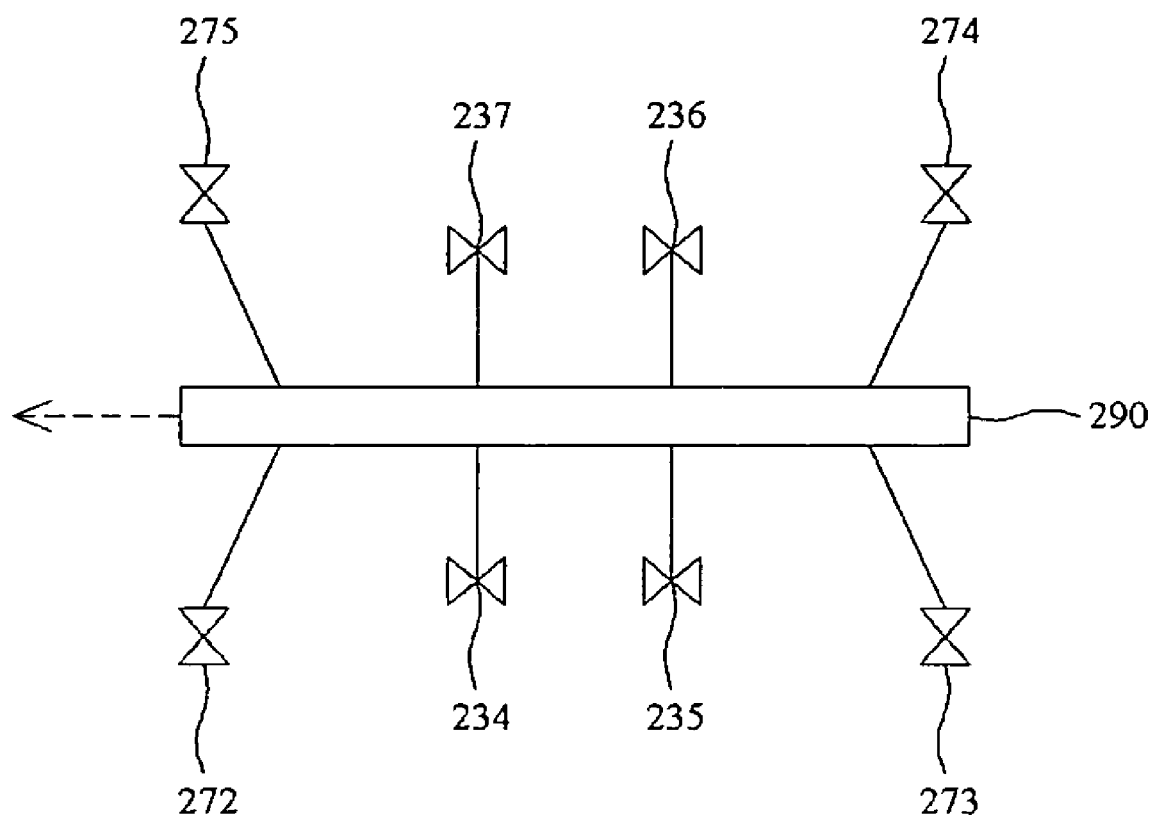
FIG. 3 is a connection of a PLC and a wet etching apparatus according to the present invention.

In FIG. 2 and FIG. 3, the etching and cleaning duct assembly system of etching solution and depurant are shown, achieving automatic filter cleaning loading a control program in programmable logic controller (PLC) 290. For example, applying the wet etching apparatus 200 of the present invention to a TFT-LCD manufacturing, using the process steps initiated by PLC 290(FIG. 3) to etch a SiOx/SiNy layer on a glass substrate comprises the following. The valves 234 and 275 are opened and valves 237 and 272 are closed to prevent the depurant 20 from flowing into the filter 211. The depurant 20 remaining in the filter cartridge 217, produced by the previous filter cleaning, thereby supplying etching solution 10 to the reaction tank 222 through a filter 212. The valve 275 is then closed and the valve 237 is opened, while the valves 235 and 236 are closed to allow the etching solution 10 to flow through the filter 211 into the reaction tank 222 without flowing into the filter 212. The valves 273 and 274 are then opened simultaneously and the depurant 20 is injected into the filter 212 to clean the filter cartridge 217. As a result, the remaining reactants and bubbles jam the filter cartridge 117 of the conventional wet etching apparatus 100 after producing about 80~200 glass substrates. The problem can be resolved by using the switching process of the apparatus 200 provided by the present invention. As mentioned above, the filter 211 of the apparatus 200 can be switched to filter 212 to filter the etching solution 10 and clean the filter 211 after about 70 glass substrates have been produced, thereby avoiding a jammed filter cartridge 217 of the filters 211 and 212. Cleaning the filter at a specified time, before jamming occurs, prevents the necessity of replacing the filter. Accordingly, the wet etching the automatic filter cleaning apparatus of the invention ameliorates the previously described disadvantages of the conventional method.

Moreover, the etching duct assembly system may use one or more filters, enabling the one filter to remain online when a second filter is being cleaned, repaired, or otherwise maintained and the entire apparatus 200 can be maintained without shutting down. While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A wet etching apparatus, comprising:
   a first tank, containing a first solution;
   a filter, having a filter cartridge, connected to the first tank to filter out the impurities in the first solution, wherein the filter has an input and an output;
   a second tank containing a second solution, connected to the input of the filter, and the first tank is also connected to the input of the filter;
   a reaction tank, wherein performing a wet etching reaction, connected to the output of the filter;
   an exhaust component, connected to the output of the filter and the reaction tank;
   a first pump, delivering the first solution to the reaction tank through the filter; and
   a second pump, delivering the second solution from the second tank to the exhaust component through the filter, thereby cleaning the filter.

2. The apparatus as claimed in claim 1, further comprising:
   a first valve, disposed between the first tank and the filter;
   a second valve, disposed between the filter and the reaction tank;
   a third valve, disposed between the second tank and the filter; and
   a fourth valve, disposed between the filter and the exhaust component.

3. The apparatus as claimed in claim 2, wherein the first pump is disposed between the first valve and the first tank.

4. The apparatus as claimed in claim 2, wherein the second pump is disposed between the third valve and the second tank.

5. The apparatus as claimed in claim 3, further comprising a fifth valve disposed between the first tank and the first pump, a sixth valve disposed between the first pump and the first valve.

6. The apparatus as claimed in claim 1, wherein the second solution is a depurant.

7. The apparatus as claimed in claim 6, wherein the depurant is deionized (DI) water.

8. The apparatus as claimed in claim 1, wherein the first solution contains a surfactant.

9. The apparatus as claimed in claim 2, wherein the first, second, third, and fourth valve is controlled by a programmable logic controller (PLC).

10. The apparatus as claimed in claim 5, wherein the fifth valve, and the sixth valve is controlled by a programmable logic controller (PLC).

11. A wet etching apparatus, comprising:
    an etching tank, containing an etching solution with a surfactant;

a filter, having a filter cartridge, connected to the etching tank to filter out the impurities in the etching solution, wherein the filter has an input and an output;

a depurant tank containing a depurant, the input of the filter connected in parallel to the depurant tank and the etching tank;

a reaction tank, connected to the output of the filter, wherein having a wet etching reaction;

an exhaust component, connected in parallel to the output of the filter and the reaction tank;

a first pump, delivering the etching solution to the reaction tank through the filter; and a second pump, delivering the depurant to the exhaust component through the filter, thereby cleaning the filter.

12. The apparatus as claimed in claim 11, further comprising:

a first valve, disposed between the first tank and the filter;

a second valve, disposed between the filter and the reaction tank;

a third valve, disposed between the depurant tank and the filter; and a fourth valve, disposed between the filter and the exhaust component.

13. The apparatus as claimed in claim 12, wherein the first pump is disposed between the first valve and the etching tank.

14. The apparatus as claimed in claim 12, wherein the second pump is disposed between the third valve and the depurant tank.

15. The apparatus as claimed in claim 12, further comprising a fifth valve disposed between the etching tank and the first pump, a sixth valve disposed between the first pump and the first valve.

16. The apparatus as claimed in claim 12, wherein the depurant is deionized (DI) water.

17. The apparatus as claimed in claim 12, wherein the first, second, third, and fourth valve is controlled by a programmable logic controller (PLC).

18. The apparatus as claimed in claim 15, wherein the fifth valve, and the sixth valve is controlled by a programmable logic controller (PLC).

19. The apparatus as claimed in claim 1, wherein the exhaust component does not connect to the reaction tank.

20. A wet etching apparatus, comprising:

a filter having an input and an output;

a first tank containing an etching solution, connected to the input of the filter;

a second tank containing a cleaning solution, connected to the input of the filter;

a reaction tank structured to perform a wet etching reaction, connected to the output of the filter;

an exhaust component, connected to the output of the filter and the reaction tank; and a valve system operatively coupled to the filter, the first tank and the second tank, which is configured to selectively direct the etching solution and the cleaning solution to the input of the filter.

21. The apparatus as claimed in claim 20, wherein the valve system is further configured to selectively direct the output from the filter to the reaction tank when etching solution is directed to the filter, and away from the reaction tank when cleaning solution is directed to the filter.

22. A method of wet-etching comprising:

providing a wet-etching apparatus as claimed in claim 20;

controlling the valve system to selectively direct etching solution from the first tank to the reaction tank via the filter to effect a wet-etching reaction, and direct cleaning solution from the second tank to the filter to clean the filter.

* * * * *